(12) United States Patent
Joyce

(10) Patent No.: US 6,243,404 B1
(45) Date of Patent: Jun. 5, 2001

(54) LASER MODULE WITH ADJUSTABLE OPERATING TEMPERATURE RANGE

(75) Inventor: William B. Joyce, Basking Ridge, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/236,720

(22) Filed: Jan. 25, 1999

(51) Int. Cl.$^7$ ........................................ H01S 3/04
(52) U.S. Cl. ............................. 372/34; 372/29.02
(58) Field of Search .................... 372/34, 29.02

(56) References Cited

U.S. PATENT DOCUMENTS

| | | |
|---|---|---|
| 4,786,132 | 11/1988 | Gordon . |
| 4,849,719 | 7/1989 | Belek et al. . |
| 4,912,715 | 3/1990 | Aoki et al. . |
| 5,717,804 | 2/1998 | Pan et al. . |
| 5,724,377 | 3/1998 | Huang . |
| 5,805,621 | 9/1998 | Grubb et al. . |
| 6,056,447 | * 5/2000 | Caras ....................................... 385/92 |

OTHER PUBLICATIONS

W.B. Joyce et al., "Thermal Resistance of Heterostructure Lasers," *Journal of Applied Physics*, vol. 46, vol. 2, Feb. 1975, pp. 855–862.

* cited by examiner

Primary Examiner—Teresa M. Arroyo
Assistant Examiner—Gioacchino Inzirillo
(74) Attorney, Agent, or Firm—J. De La Rosa

(57) ABSTRACT

The present invention is directed to a method for adjusting the operating temperature range of a laser module such that it substantially covers or is coextensive with the span in temperatures for the desired application. In accordance with the principles of the invention, it has been found that the laser module's operating temperature range can be readily adjusted by judiciously increasing its thermal resistance so as to elevate, and thereby offset the laser's temperature from its ambient or surrounding temperature. As such, by judiciously impeding the laser module's heat flow, the laser module's operating locking temperature range can be made to be cover the span in temperatures for the desired application. Preferably, washers of a known thermal resistance are employed to increase the laser module's thermal resistance to accordingly impede heat flow from the laser to its surroundings, and thereby offset the laser's temperature.

38 Claims, 5 Drawing Sheets

LASER MODULE WITH ADJUSTABLE OPERATING TEMPERATURE RANGE

TECHNICAL FIELD

The present invention relates to optical modules and, more particularly, to laser modules used in lightwave transmission systems.

BACKGROUND OF THE INVENTION

Typically, optical modules house optical components hermetically in a box, such as in a so-called "14-pin butterfly" housing or package. For example, laser modules used in lightwave transmission systems include a semiconductor laser configured to emit coherent radiation for communication purposes. Although the laser resonates over a range of frequencies, the laser is typically confined to operate at, or is so-called "locked" to a single desired wavelength, even with variations in temperature, such as by using an external fiber grating. This locking mechanism, however, only works over a particular range in temperatures.

Accordingly, such laser modules are specifically manufactured so that the laser properly locks over the span in temperatures for the desired application. That is, the laser's so-called "locking range" is nominally designed to match the desired operating temperature range. Unfortunately, for various manufacturing reasons, the laser's locking temperature range may not match the span in temperatures for the desired application. Although the laser's temperature can be maintained to fall within its locking range using thermal electric coolers (TECs) or resistive heaters, it may not be practical to do so for certain applications because of reliability and maintenance considerations, such as for so-called "submarine" applications.

In the prior art, the prevailing wisdom is either to discard or rework the laser module, which in either case is usually cost prohibitive. It would therefore be desirable to provide for an improved laser module wherein its operating temperature range is readily adjustable so as to substantially cover or be coextensive with the span in temperatures for the desired application.

SUMMARY OF THE INVENTION

The present invention is directed to a method for adjusting the operating temperature range of a laser module such that it substantially covers or is coextensive with the span in temperatures for the desired application. In accordance with the principles of the invention, it has been found that the laser module's operating temperature range can be readily adjusted by judiciously increasing its thermal resistance so as to elevate, and thereby offset the laser's temperature from its ambient or surrounding temperature. As such, by judiciously impeding the laser's heat flow, the laser module's operating temperature range can be made to be cover the span in temperatures for the desired application. Preferably, washers of known thermal resistance are employed to increase the laser module's thermal resistance to accordingly impede heat flow from the laser to its surroundings, and thereby offset the laser's temperature.

In an exemplary embodiment, the inventive method is applied to a laser module comprising a "14-pin butterfly" housing configured to contain a semiconductor laser chip that emits coherent light. To stabilize lasing with variations in temperature, a fiber grating is employed which consists of a periodic variation in the refractive index of the fiber's core. Although the laser is designed to lock over the span in temperatures for the desired application, its locking range may not cover or be coextensive with the span in temperatures for the desired application. The laser module is modified, however, to include thermal element(s) capable of increasing the laser module's thermal resistance to accordingly impede heat flow to its surroundings. Each thermal element is formed to comprise a thickness t, having a known thermal resistance R, defined as that quantity which when multiplied by the heat flux, H, entering into the thermal element yields the change in temperature.

Suitable materials for the thermal elements include, Kovar, BeO, Si, and plastics, with the thermal elements preferably fabricated as a washer. Neglecting other power sources in the laser module, the laser's temperature is approximately elevated by an amount $\Delta T = \eta(VI) \times R_T$, where V and I are the laser's operating voltage and current, respectively, $\eta$ is the dissipation factor, and $R_T$ is the total thermal resistance of the thermal elements.

In accordance with the teachings of the present invention, the laser module's operating temperature range can readily be made substantially coextensive with the desired operating temperature range by simply elevating the laser's temperature by an amount, $\Delta T$, corresponding to the offset between the laser's locking range and the span in temperature for the desired application. Inasmuch as the laser's temperature, however, can only be elevated to a higher temperature, the laser should be preferably be designed to operate at a temperature range slightly above the desired span in temperatures. In this manner, the laser's temperature can always be elevated from the ambient temperature so that the laser module operates properly within the span of temperatures for the desired application.

In certain instances, the laser's locking range may not be simply offset from the span in temperatures for the desired application, but also may be narrower. In another aspect of the present invention, the laser's module's operating temperature range may be centered with the span in temperatures for the desired application, improving the laser module's centering over the desired span in temperature. Of course, in those instances where the laser's locking range is broader than, but offset from the desired temperature range, the laser's operating temperature range may be adjusted anywhere within the desired temperature span, but should preferably be centered.

In accordance with another aspect of the present invention, it is contemplated that the operating temperature range of the laser module may be extended by purposely designing the gain peak and grating wavelengths to be offset, and then elevating the laser's temperature from its surroundings. In this latter manner, the laser module's operating temperature range can be extended as well as adjusted so as to substantially operate within the span in temperatures for the desired application.

BRIEF DESCRIPTION OF THE DRAWINGS

The features and advantages of the present invention will become more readily apparent from the following detailed description of the invention in which like elements are labeled similarly and in which.

DETAILED DESCRIPTION

The present invention is directed to a method for adjusting the operating temperature range of a laser module employing a laser having a locking mechanism which maintain its lasing wavelength at a desired value with variations in temperature. More particularly, the method affords the ability to readily adjust such a laser module's operating temperature range such that it is substantially covers or is coextensive with the span in temperatures for the desired application. Laser modules which employ external gratings to provide narrow linewidth, wavelength stable light particularly benefit from the inventive method.

In accordance with the principles of the invention, it has been discovered that the laser module's operating temperature range can be readily adjusted by judiciously increasing the thermal resistance of the laser module so as to elevate, and thereby offset the laser's temperature from its ambient or surrounding temperature. As such, by judiciously impeding the laser module's heat flow, the laser modules's operating temperature range can be made to substantially cover the span in temperatures for the desired application. Although the ambient or surrounding temperature lies within the span in temperatures for the desired application, the laser's temperature is actually at an elevated temperature such that now its temperature range covers or is substantially coextensive with the laser's locking range. In this manner, the laser module's operating temperature range now likewise covers or is coextensive with the span in temperatures for the desired application.

Preferably, the inventive method uses washers of known thermal resistance to increase the laser module's thermal resistance to accordingly impede heat flow from the laser to its surroundings, and thereby offset the laser's temperature, as discussed more fully herein below.

Without any loss of generality or applicability for the principles of the invention, the present inventive method is described with respect to a laser module employing an external fiber grating. It should be clearly understood, however, that the present invention is equally applicable to other types of laser modules, such as those employing other means to stabilize lasing with variations in temperature.

Figure 1:
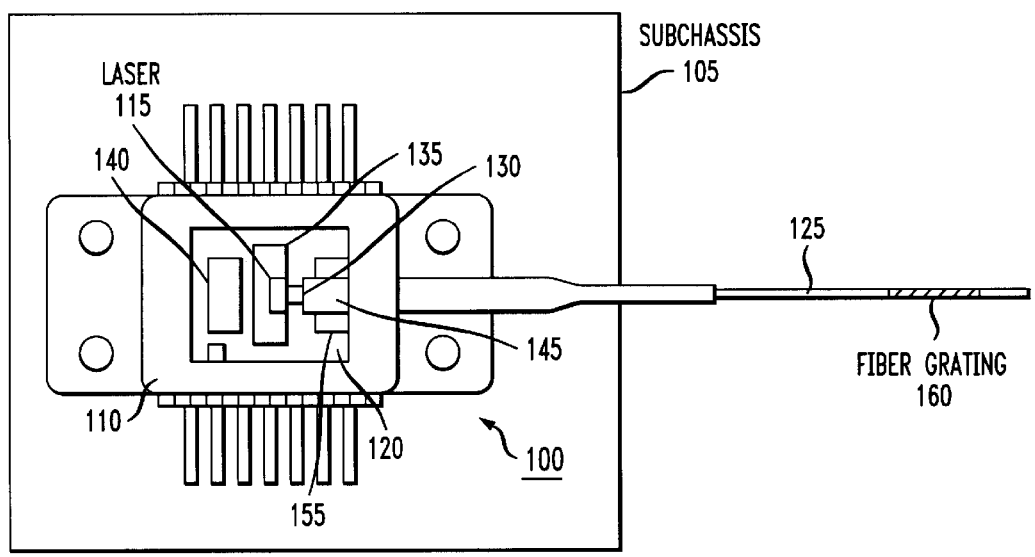
FIG. 1 shows a plan view of a prior art laser module attached to the subchassis of an optical package.
Figure 2:
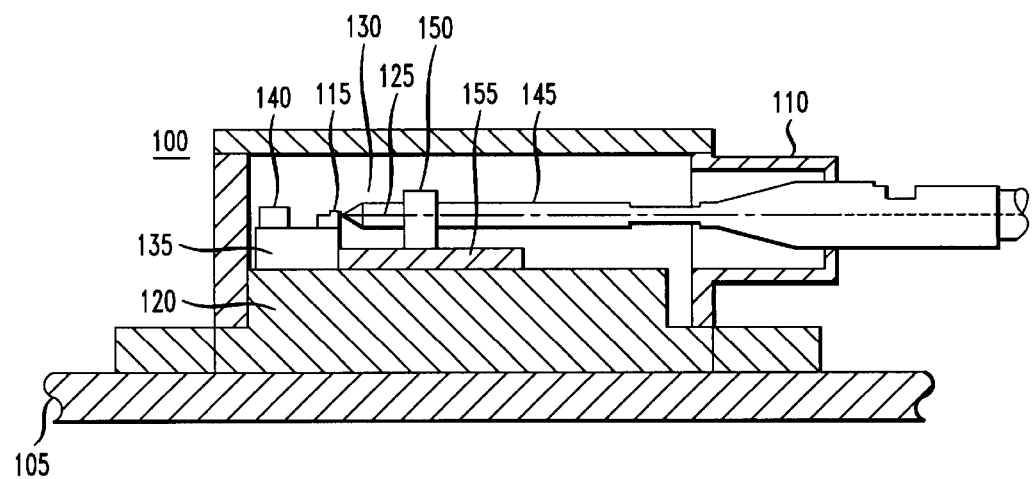
FIG. 2 shows a simplified cut-away view of the prior art laser module of FIG. 1.

Referring to FIGS. 1–2, there is shown a typical prior art laser module 100, which is attached to a subchassis 105, such as, for example, to the housing base of an optical transmitter. Laser module 100 comprises a "14-pin butterfly" housing 110 configured to contain a semiconductor laser 115 that emits coherent light, such as at 980 nm. Housing 110 preferably includes an opening along its top side for providing access to the interior thereof, and an assembly platform 120. There is an opening at an end sidewall of housing 110 for allowing the passage of an optical fiber 125 into the interior of the housing, with preferably a micro-lens 130 for coupling the light emitted from laser 115 into fiber 125.

Laser 115 is supported on a carrier 135, and in turn, the carrier is attached to assembly platform 120. A photodetector 140 may also be disposed on carrier 135 to monitor the optical power from laser 115. Because of mechanical, electrical and thermal considerations, the carrier and assembly platform are usually made of dissimilar materials. For example, carrier 135 may be made of BeO, which is not only a good electrical insulator, but also a good thermal conductor. Also, it is customary for assembly platform 120 to be made of a Cu-W composite, which is likewise a good thermal conductor. Following conventional wisdom, heat generated within the laser itself is thus quickly dissipated so as to limit any deleterious effects of temperature-dependent processes.

Optical fiber 125 is held within a metal ferrule 145 which extends through the opening to the exterior of housing 110. Alignment between fiber 125 and laser 115 is maintained, for example, by a clip 150 which is welded to ferrule 145 as well as to a carrier 155 which in turn is soldered to assembly platform 120. To stabilize lasing with variations in temperature, a fiber grating 160, for example, is connected to fiber 125 and consists of a periodic variation in the refractive index of the fiber's core, which variation has been denoted by heavy marks. See, for example, *Lightwave Applications of Fibre Bragg Gratings, IEEE Journal of Lightwave Technology*, Vol. 15, No. 8, August 1997, pp. 1391–1404.

In effect, the cavity of the laser now extends into fiber 125, with the grating forming one of the laser's end facets. Fiber grating 160 is designed to reflect back into the laser cavity substantially only a single wavelength, $\lambda_g$, nominally the gain peak wavelength $\lambda_p$ of laser 115. Thus, although laser 115 resonates over a range of frequencies, the laser is confined to operate at or so-called "locked" to a single wavelength, $\lambda_g$, since there is substantially less feedback at any other wavelength. This arrangement has the benefit that the linewidth of the laser's output is narrowed considerably after passing through fiber grating 160.

Figure 3:
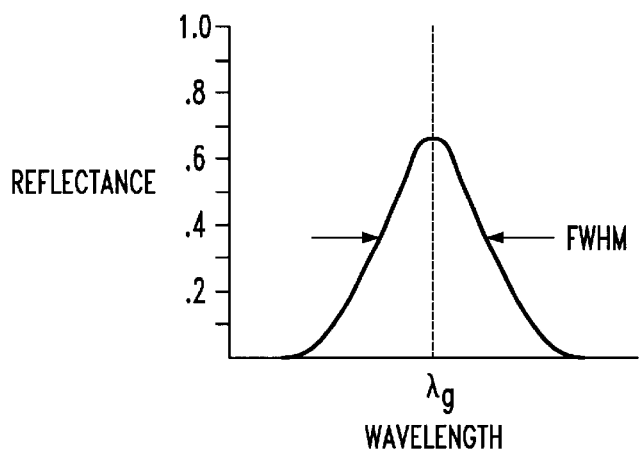
FIG. 3 shows an exemplary graph of reflectance versus wavelength for the fiber grating of the prior art laser module of FIGS. 1 and 2.
Figure 4:
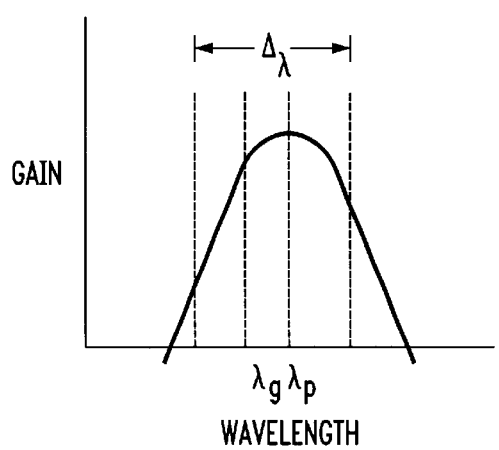
FIG. 4 shows an exemplary graph of laser gain versus wavelength along with the grating wavelength depicted on the graph.

Shown in FIG. 3 is an exemplary reflection spectrum of fiber grating 160 with the grating's peak reflectivity wavelength or so-called "grating wavelength" denoted as $\lambda_g$. Note also that the full-width half maximum spectral width has been denoted as "FWHM" in accordance with the conventional notation in the art. As mentioned above herein, in order for the above latter locking mechanism to work, the grating wavelength $\lambda_g$ must be substantially close to the gain peak wavelength $\lambda_p$ of the laser, i.e., within the so-called "spectral locking-range" $\Delta_\lambda$ of the laser, typically a couple of nanometers (nm). This phenomenon is illustrated in FIG. 4 which displays a graph of the laser gain versus wavelength along with a representation of the grating wavelength, $\lambda_g$. So long as the grating wavelength $\lambda_g$ is within the spectral locking range $\Delta_\lambda$, which has been depicted in phantom in FIG. 4, the laser lases at the grating wavelength, $\lambda_g$, even with variations in temperature.

Referring again to FIG. 2, note that in this instance, the laser's temperature is substantially the same as that of the ambient or the surrounding temperature. For undersea or so-called "submarine" applications, wherein the ocean acts as a highly conductive heat sink, the laser's temperature correspondingly follows the variations in the ocean's temperature. With temperature variations in the laser's temperature, the gain peak wavelength $\lambda_p$ of the laser shifts away from the grating wavelength, $\lambda_g$, about a few tenths of a nanometer per degree centigrade (nm/° C.). As such, the laser can only be operated over a certain temperature range. This corresponding temperature locking range, $\Delta_T$, is dependent on the reflectivities of the laser's end facets, and the reflective characteristics of the grating. The gain peak wavelength, $\lambda_p$ substantially matches the grating wavelength, $\lambda_g$ near or at the center temperature of the locking range $\Delta_T$.

Accordingly, laser 115 is specifically manufactured so that it locks over the span in temperatures for the desired application. That is, the laser's temperature locking range $\Delta_T$ is nominally designed to substantially coincide with the desired operating temperature range of laser module 100. For various manufacturing reasons, however, the laser's locking range may not be within or be coextensive with the span in temperatures for the desired application. The laser's locking range, for example, may be offset several degrees from the desired operating temperature range of the laser module.

Although the laser's temperature can be maintained to fall within its measured locking range using thermal electric coolers (TECs) or resistive heaters, it may not be practical to do so for certain applications because of reliability and maintenance considerations, such as for submarine applications. In accordance with the teachings of the present invention, the laser module's operating temperature range may be judiciously adjusted by increasing the thermal resistance of the laser module so as to elevate the laser's temperature such that the laser module's operating temperature range substantially covers or is coextensive with the span in temperatures for the desired application.

Figure 5:
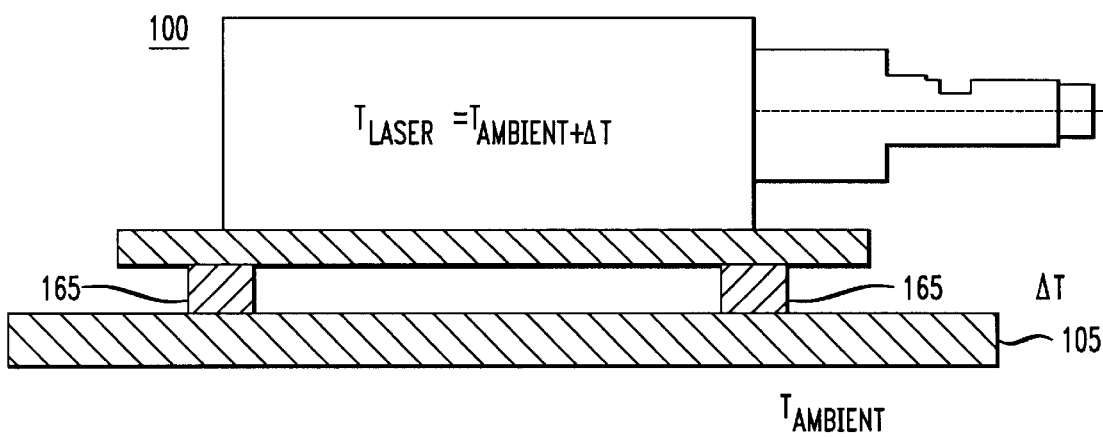
FIG. 5 shows an exemplary laser module of the present invention, illustrating in particular thermal element(s) having a total thermal resistance capable of elevating the temperature of the laser.

Referring to FIG. 5, there is illustrated an exemplary embodiment of the present invention, including thermal resistance means capable of increasing the laser module's thermal resistance to accordingly impede heat flow. In this manner, the laser's temperature, $T_{laser}$ is elevated from the ambient temperature, $T_{ambient}$, such that the laser module's operating temperature range covers or coextensive with the span in temperatures for the desired application. In particular, laser module 100 of FIG. 1 is modified to include thermal element(s) 165 disposed, for example, between laser module 100 and subchassis 105. Each thermal element 165 is formed to comprise a thickness t, having a thermal resistance R, defined as that quantity which when multiplied by the heat flux, H, entering into the thermal element yields the change in temperature. Note that the total thermal resistance RT of thermal elements 165 is given by $$\frac{1}{R_T} = \frac{1}{R_1} + \ldots \frac{1}{R_n},$$

where $R_n$ is the thermal resistance of the $n^{th}$ thermal element. In other words, the laser's temperature is elevated to a temperature approximately given by $T_{laser}=T_{ambient}+\Delta T$, where $\Delta T=H \times R_T$. The particular material chosen for thermal elements 165 is dependent on various design considerations, such as, for example, the desired metallurgical properties of the material. Suitable materials for thermal elements 165, however, may include Kovar, BeO, Si, and plastics, among others.

Preferably, thermal elements 165 are fabricated as a parallelipiped, such as annular or solid washers. For a parallelipiped of conductivity $\sigma$, area A, and thickness t, its thermal resistance R may be approximated as $R=t/\sigma A$ and expressed in units of degrees per Watts (°/W). As such, thermal elements of different known thermal resistance can be readily fabricated by varying the thickness and/or area of the washer, and kept in inventory. Of course, the thermal resistance for other shaped thermal elements can be readily determined, such as through empirical means.

The utilization of thermal elements 165, such as a washer, increases the thermal resistance of laser's module 100 by an amount $R_T$, accordingly impeding heat flow, and thereby increasing the laser's temperature. Neglecting other power sources in the laser module, the heat generated by the laser module is approximately given by $\eta$ (VI), where V and I are the laser's operating voltage and current, respectively, and $\eta$ is the dissipation factor or the ratio of the power converted into heat. For this approximation, the laser's temperature is accordingly elevated by an amount $\Delta T=\eta(VI) \times R_T$.

Figure 6:
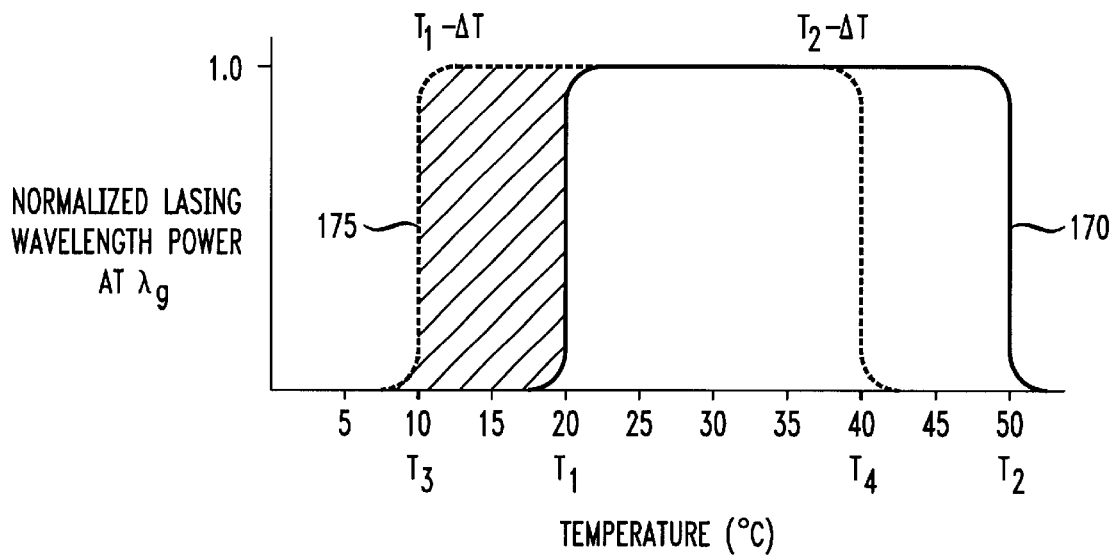
FIGS. 6–10 show exemplary graphs of the locking ranges of the laser and the corresponding operating temperature ranges of the laser module useful in depicting different aspects of the present invention.

Shown in FIG. 6 is an exemplary illustration of the actual operating temperature range of laser module 100. In this exemplary illustration, although laser 115 has been designed to lock over the desired span in temperatures of $T_3-T_4$ (10–40° C.), its actual locking range of $T_1-T_2$, as depicted in curve 170, extends only from about 20–50° C. Likewise, the laser module's operating temperature range is also between 20–50° C. In this exemplary illustration, the dissimilar temperature ranges thus causes the laser module unfortunately not to function properly at the desired wavelength for temperatures between 10–20° C. In accordance with the teachings of the present invention, the laser module's operating temperature range can readily be made substantially coextensive with its operating temperature range by simply elevating the laser's temperature by an amount, $\Delta T$, of 10° C. from its ambient or surrounding temperature. Thus, at ambient temperatures of 10–40° C., the laser is actual operating at a temperature range of 20–50° C. The operating temperature range of laser module 100 ($T_1-\Delta T$ through $T_2-\Delta T$) now, however, is coextensive with the span in temperatures for the desired application ($T_3$ through $T_4$).

Accordingly, thermal elements 165 can be judiciously selected to elevate the laser's temperature by the above amount in accordance with the following equation, $R_T=\Delta/\eta VI$. With the laser operating, for example, at 1.3 V and 0.2 A, and $\eta=0.5$, the total thermal resistance RT of thermal elements should be approximately 77° C./W. The operating temperature range of laser module 100 is depicted as curve 175 in FIG. 6. Note that although the laser is actually operating at a temperature range of $T_1$ through $T_4$ (20–50° C.), the laser module is operating at a temperature range of about $T_1-\Delta T$ through $T_2-\Delta T$ (10–50° C.) due to thermal elements 165 which elevate the laser's temperature by $\Delta T$ (10° C.). Although there is a small penalty in the laser's lifetime for operating the laser at a higher temperature, for most applications it is anticipated that this penalty is an acceptable tradeoff.

Should the laser module's operating temperature range still not cover or be coextensive with the desired span in temperatures, thermal elements 165 can of course be readily adjusted using different thermal elements to fine tune accordingly the laser module's operating temperature range. Inasmuch as the laser's temperature, however, can only be elevated to a higher temperature, the laser should be preferably be designed to operate at a temperature range slightly above the span in temperatures for the desired application. In this manner, the laser's temperature can always be elevated from the ambient temperature so that the laser module can operate properly within the desired span of temperatures.

Figure 7:
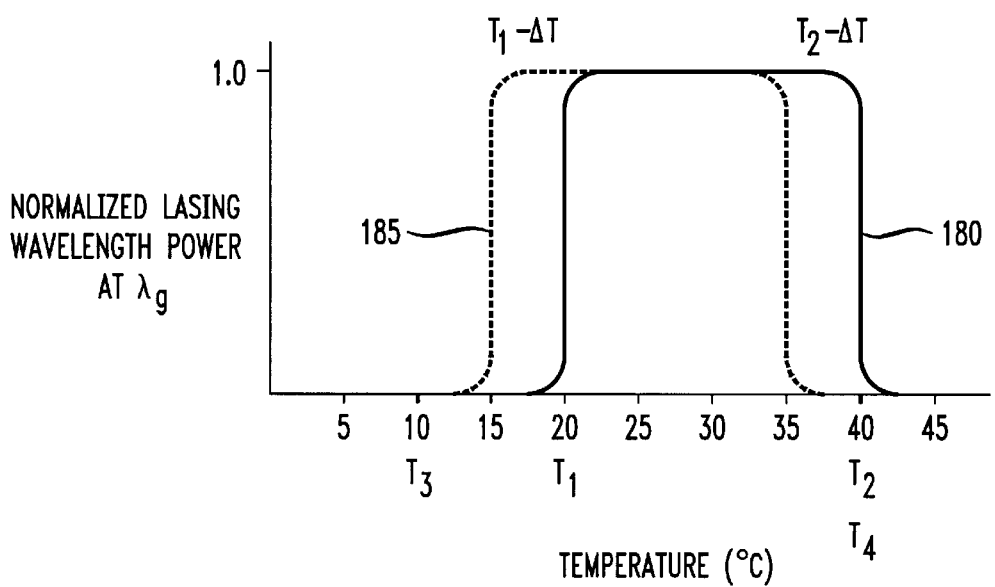

In certain instances, the laser's locking range may not be simply offset from the span in temperatures for the desired application, but also may be narrower. For example, in another exemplary illustration, although designed to lock over a temperature range of $T_3$ through $T_4$ (10–40° C.), laser 115 may only lock over a temperature range of $T_1$ through $T_2$ (20–40° C.), as depicted in curve 180 of FIG. 7. Accordingly, the laser's module operating temperature range (20–40° C.) is narrower than desired range of 10–40° C. Centering the laser module's operating temperature range within the span in temperatures for the desired application would, however, improve the laser module's range of operation. As such, the laser's temperature can be elevated by 5° C. from its ambient temperature such that the laser operating temperature range ($T_1$–$\Delta T$ through $T_2$–$\Delta T$) is now 15–35° C., as depicted in curve 185 of FIG. 7.

Figure 8:
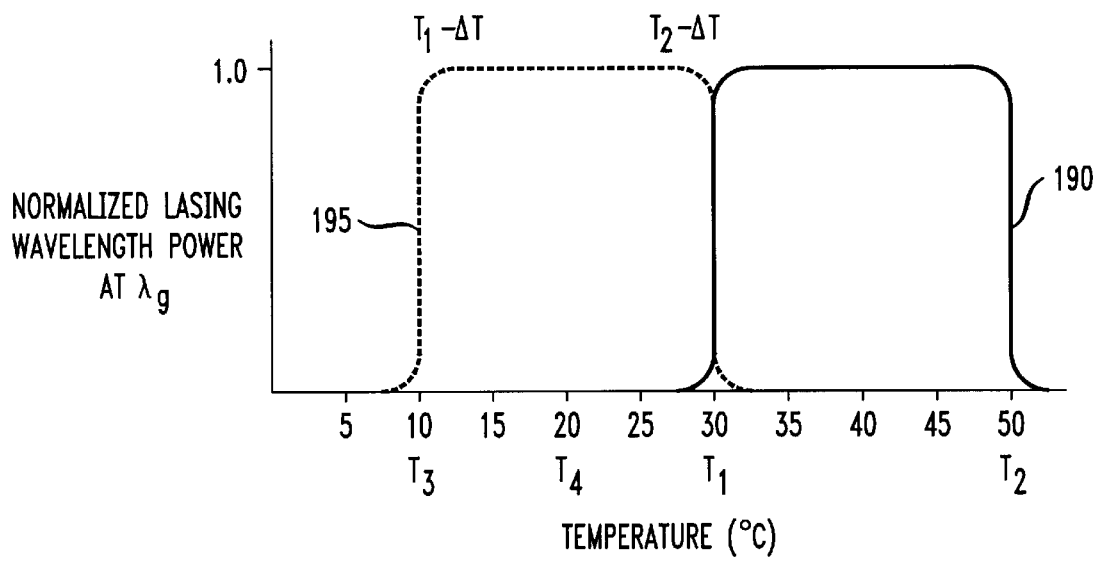
Figure 9:
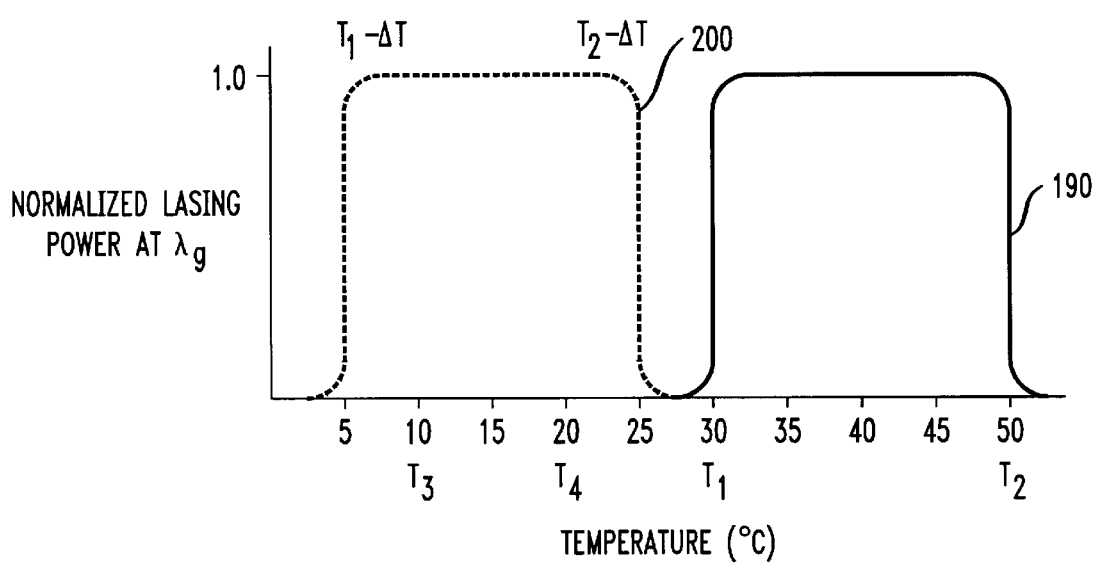

Of course, in those instances where the laser's locking temperature range is broader than, but offset from the desired span in temperature range, the laser module's operating temperature range may be adjusted using the above described thermal elements to position the laser's locking range such that the laser module's operating temperature range covers the desired temperature span. Preferably, however, the laser's module operating temperature range should be centered with the desired span in temperatures. This latter example is illustrated in FIGS. 8 and 9, wherein the laser's locking range ($T_1$ through $T_2$) is between 30–50° C. (curve 190), whereas the desired span in temperatures ($T_3$ through $T_4$) is between 10–20° C. Using an appropriate thermal elements 165, the locking range of the laser may be adjusted such that the operating temperature range of the laser module covers the desired temperature range. For example, the operating temperature range of the laser module may be adjusted to cover 10–30° C. (curve 195) by elevating the laser's temperature by 20° C. Or, the operating temperature range of the laser module can be centered with the desired temperature range (curve 200), by elevating the laser's temperature by 25° C., which is preferable.

It may be unacceptable in those instances where the locking range of the laser is narrower than the span in temperature for the desired application to adjust the laser module's operating temperature range so that it is centered with the desired span in temperatures. In accordance with another aspect of the present invention, it contemplated than the locking range of the laser can be extended by purposely designing the gain peak ($\lambda_p$) and grating wavelengths ($\lambda_g$) to be offset. By then elevating the laser's temperature from its surrounding or ambient temperature, the laser module's operating temperature range can be similarly extended as well as adjusted to substantially operate within the span in temperatures for the desired application.

As discussed herein above, to effect locking, the grating wavelength $\lambda_g$ must be within the locking range from the gain peak wavelength $\lambda_p$ of the laser. Although with increasing temperature, the gain peak wavelength $\lambda_p$ shifts away from the grating wavelength $\lambda_g$, the gain also accordingly broadens. As such, the laser's locking range widens with the nominal operating temperature. For relatively small temperature variations, the locking range varies linearly by $\Delta_2 = \alpha(T_2-T_1)\Delta_1 + \Delta_1$, where $\Delta_1$ and $\Delta_2$ are the locking ranges at nominal temperatures $T_1$ and $T_2$, respectively, and $\alpha$ is a constant. Note that herein the nominal temperature is that temperature where the gain peak wavelength $\lambda_p$ substantially matches the grating wavelength $\lambda_g$. As such, the grating wavelength, $\lambda_g$, should be adjusted to match the shift in the laser's gain peak wavelength, $\lambda_p$, with changes in temperature, herein referred to as the "matching wavelength". Also, it should be understood that $\alpha$ is preferably determined empirically, but is typically about a 2–4%/° C., and is highly dependent on the design of the laser.

Figure 10:
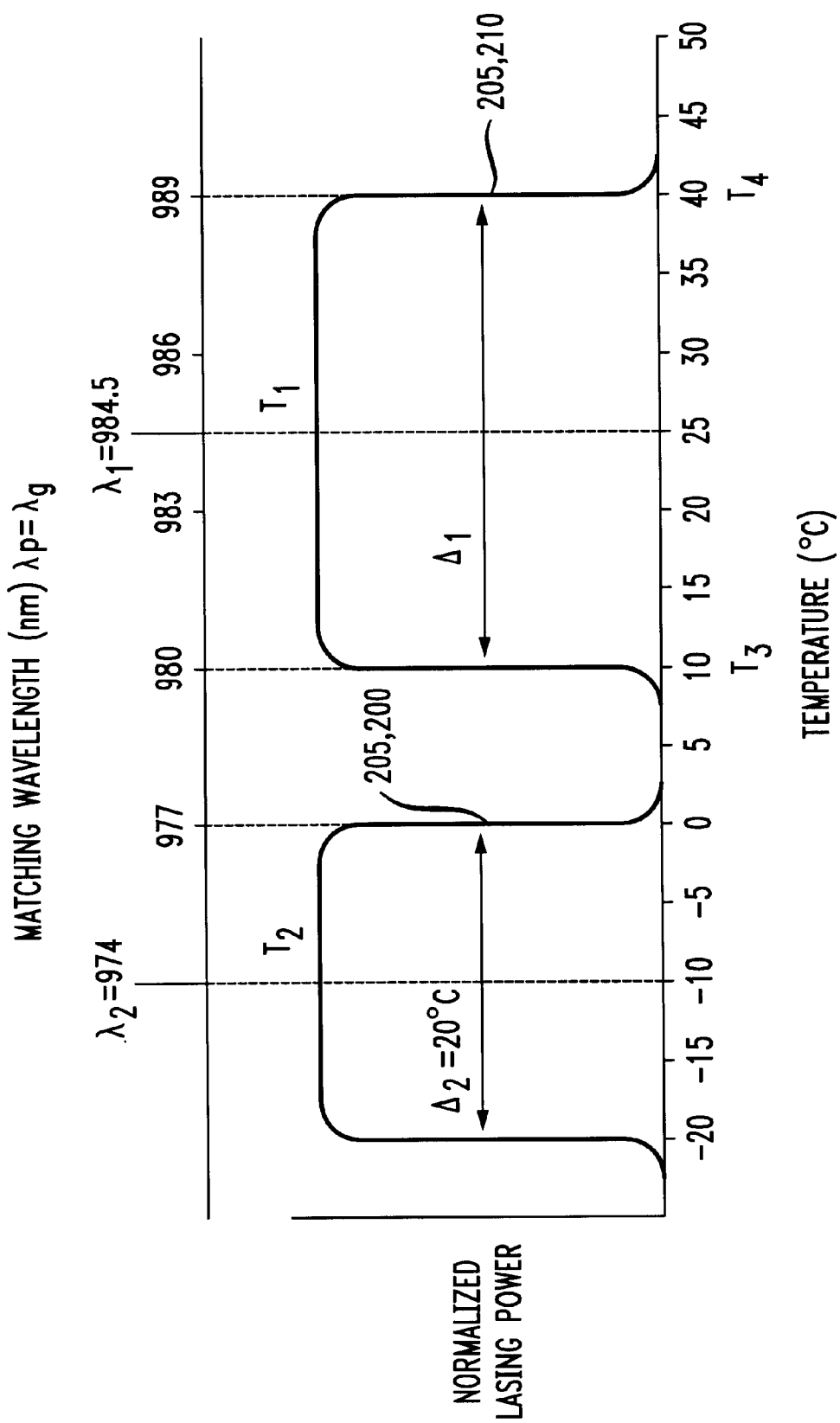

Accordingly, if the laser is desired to lase at a wavelength $\lambda_1$ over a locking range $\Delta_1$ for a nominal temperature, $T_1$, the laser is initially designed to lase at a shorter wavelength $\lambda_2$ over a narrower locking range $\lambda_2$ for a lower nominal temperature, $T_2$. The laser's locking range is then widen approximately to $\Delta_1$ by elevating the laser's nominal temperature to $T_1$ using thermal elements 165, which also adjusts the operating temperature range of the laser module so as to cover the desired span in temperatures. For example, laser module 100 may be made to operate over the desired operating temperature range ($T_3$–$T_4$) of 10–40° C. for a desired lasing wavelength of $\lambda_1$=984.5 nm by initially designing the laser to have a locking range of only $\Delta_2$=20° C. at a nominal temperature of $T_2$=–10° C. ($\lambda_2$=974 nm) as depicted in curve 205 of FIG. 10, and then elevating the laser's nominal temperature to $T_1$=25° C. ($\lambda_1$=984.5 nm) using an appropriate thermal element(s) 165 disposed underneath laser module 100. In elevating the laser's temperature, not only is the laser's locking range extended to a span of $\Delta_1$=34° C. ($\alpha$=0.02/°C.), but the laser module's operating temperature range now spans from about 8–42° C. (curve 210), which covers the span in temperatures for the desired application (10–40° C.).

It should be understood that the embodiments herein above are merely illustrative of the principles of the invention. Various modifications may be made by those skilled in the art which will embody the principles of the invention and fall within the spirit and the scope thereof.

What is claimed is:

1. A method for adjusting the operating temperature range of a laser module having a base supporting a laser substantially lasing at a desired wavelength at temperatures between $T_1$ and $T_2$, said method comprising the steps of:

attaching thermal means to said base so as to elevate the temperature of said laser an amount $\Delta T$ from the laser module's ambient temperature such that the operating temperature range of said laser module is about $T_1$ minus $\Delta T$ through $T_2$ minus $\Delta T$, wherein $T_2$ is greater than $T_1$, and $\Delta T$ is greater than zero; and adjusting the thermal resistance R of said thermal means such that said operating temperature range of said laser module substantially covers the span in temperatures for the desired application.

2. The method of claim 1 wherein in the step of adjusting the thermal resistance R, said operating temperature range of said laser module is made substantially coextensive with the span in temperatures for the desired application.

3. The method of claim 1 wherein in the step of adjusting the thermal resistance R, said operating temperature range of said laser module is substantially centered with the span in temperatures for the desired application.

4. The method of claim 1 wherein $\Delta T$ is approximately given by $\eta(VI) \times R$, wherein V and I are the operating voltage and current, respectively, of said laser, and $\eta$ is the dissipation factor.

5. The method of claim 1 wherein said thermal means is a parallelipped.

6. The method of claim 5 wherein said thermal resistance R is given by $t/\sigma A$, where t is thickness of the thermal means, A is the area of said thermal means, and a is the conductivity of the thermal means.

7. The method of claim 1 wherein said thermal means includes a plurality of thermal resistance elements, wherein the total thermal resistance $R_T$ of the thermal means is given by $$\frac{1}{R_T} = \frac{1}{R_1} + \cdots \frac{1}{R_n},$$

where $R_n$ is the thermal resistance of the $n^{th}$ thermal resistance element.

8. The method of claim 1 wherein said thermal means includes a washer.

9. The method of claim 1 wherein said laser includes a fiber grating for stabilizing lasing with variations in temperature.

10. The method of claim 9 further comprising the step of substantially matching the grating wavelength $\lambda_g$ of said fiber grating to the gain peak wavelength $\lambda_p$ of said laser.

11. The method of claim 1 wherein in elevating the temperature of said laser from $T_1$ to $T_2$, the locking range of said laser is extended from $\Delta_1$ to $\Delta_2$, respectively.

12. The method of claim 10 wherein $\Delta_2 = \alpha(T_2-T_1)\Delta_1+\Delta_1$, wherein $\alpha$ is a constant.

13. A method for setting the operating temperature range of a laser module having a base supporting a laser, said method comprising the steps of:
designing said laser to lase at a wavelength $\lambda_1$ over a locking range $\Delta_1$ for a nominal temperature of $T_1$;
attaching thermal means to said base so as to elevate the temperature of said laser an amount $\Delta T$ from the ambient temperature of the laser module to a nominal temperature $T_2$, thereby widening the locking range of said laser from $\Delta_1$ to $\Delta_2$ for a lasing wavelength of $\lambda_2$, with the operating temperature range of said laser module substantially centered at $T_2$, and extending about $\Delta_2$, wherein $T_2 \geq T_1$, $\lambda_2 \geq \lambda_1$, and $\Delta T \geq 0$; and
adjusting the thermal resistance R of said thermal means such that said operating temperature range of said laser module substantially covers the span in temperatures for the desired application.

14. The method of claim 13 wherein in the step of adjusting the thermal resistance R, the operating temperature range of said laser module is made substantially coextensive with the span in temperatures for the desired application.

15. The method of claim 13 wherein in the step of adjusting the thermal resistance R, the operating temperature range of said laser module is substantially centered with the span in temperatures for the desired application.

16. The method of claim 13 wherein $\Delta T$ is approximately given by $\eta VI \times R$, wherein V and I are the operating voltage and current, respectively, of said laser, and $\eta$ is the dissipation factor.

17. The method of claim 13 wherein said thermal means is a parallelipped.

18. The method of claim 17 wherein said thermal resistance R is given by $t/\sigma A$, where t is thickness of the thermal means, A is the area of said thermal means, and $\sigma$ is the conductivity of the thermal means.

19. The method of claim 13 wherein said thermal means includes a plurality of thermal resistance elements, wherein the total thermal resistance $R_T$ of the thermal means is given by $$\frac{1}{R_T} = \frac{1}{R_1} + \cdots \frac{1}{R_n},$$

where $R_n$, is the thermal resistance of the $n^{th}$ thermal resistance element.

20. The method of claim 13 wherein said thermal means includes a washer.

21. The method of claim 13 wherein said laser includes a fiber grating for stabilizing lasing with variations in temperature.

22. The method of claim 21 further comprising the step of substantially matching the grating wavelength $\lambda_g$ of said fiber grating to the gain peak wavelength $\lambda_p$ of said laser.

23. The method of claim 13 wherein $3\Delta_2 = \alpha(T_2-T_1)\Delta_1+\Delta_1$, wherein $\alpha$ is a constant.

24. A laser module including a base for supporting a laser contained therein having a locking range between $T_1$ and $T_2$, said module comprising thermal means for impeding the heat flow from said laser to the surroundings of said laser module, the thermal means having a thermal resistance R sufficient to elevate the temperature of said laser an amount $\Delta T$, such that the operating temperature range of said laser module is from $T_1-\Delta T$ through $T_2-\Delta T$, wherein $T_2$ is greater than $T_1$, and $\Delta T$ is greater than zero.

25. The laser module of claim 24 wherein the operating temperature range of said laser module is substantially coextensive with the span in temperatures for the desired application.

26. The laser module of claim 24 wherein the operating temperature range of said module lies within the span in temperatures for the desired application.

27. The laser module of claim 24 wherein the operating temperature range of said module is substantially centered with the span in temperatures for the desired application.

28. The laser module of claim 24 wherein $\Delta T$ is approximately given by $\eta VI \times R$, wherein V and I are the operating voltage and current, respectively, of the laser, and $\eta$ is the dissipation factor.

29. The laser module of claim 24 wherein said thermal means is a parallelipped.

30. The laser module of claim 29 wherein said thermal resistance R is given by $t/\sigma A$, where t is thickness of the thermal means, A is the area of said thermal means, and $\sigma$ is the conductivity of the thermal means.

31. The laser module of claim 24 wherein said thermal means includes a plurality of thermal resistance elements, the total thermal resistance $R_T$ of the thermal means given by $$\frac{1}{R_T} = \frac{1}{R_1} + \cdots \frac{1}{R_n},$$

where $R_n$ is the thermal resistance of the $n^{th}$ thermal resistance element.

32. The laser module of claim 24 wherein said thermal means includes a washer.

33. The laser module of claim 24 wherein said thermal means is attached to said base of the housing.

34. The laser module of claim 24 further comprising a fiber grating which stabilizes the lasing of said laser with variations in temperature.

35. The laser module of claim 34 wherein the grating wavelength of said fiber grating substantially matches the gain peak wavelength of said laser.

36. The laser module of claim 24 further comprising an optical fiber disposed within an opening of said housing for receiving light emitted from said laser.

37. The laser module of claim 24 wherein in elevating the temperature of said laser from $T_1$ to $T_2$, the locking range of said laser is extended from $\Delta_1$ to $\Delta_2$, respectively.

38. The laser module of claim 24 wherein $\Delta_2 = \alpha(T_2-T_1)\Delta_1+\Delta_1$, wherein $\Delta$ is a constant.

* * * * *